United States Patent
Gorisse et al.

(10) Patent No.: US 11,181,605 B2
(45) Date of Patent: Nov. 23, 2021

(54) METHOD AND DEVICE FOR ESTIMATING AN ANGLE OF ARRIVAL OF AN INCIDENT RADIO SIGNAL

(71) Applicant: THALES, Courbevoie (FR)

(72) Inventors: Benoît Gorisse, Brest (FR); Daniel Jahan, Brest (FR); Cédric Cornu, Brest (FR)

(73) Assignee: THALES, Courbevoie (FR)

(*) Notice: Subject to any disclaimer, the term of this patent is extended or adjusted under 35 U.S.C. 154(b) by 188 days.

(21) Appl. No.: 16/620,410

(22) PCT Filed: May 30, 2018

(86) PCT No.: PCT/EP2018/064167
§ 371 (c)(1),
(2) Date: Dec. 6, 2019

(87) PCT Pub. No.: WO2018/224371
PCT Pub. Date: Dec. 13, 2018

(65) Prior Publication Data
US 2020/0142020 A1 May 7, 2020

(30) Foreign Application Priority Data
Jun. 9, 2017 (FR) ...................................... 17 00615

(51) Int. Cl.
*G01S 3/74* (2006.01)
*G01R 23/18* (2006.01)
(Continued)

(52) U.S. Cl.
CPC ................ *G01S 3/74* (2013.01); *G01R 23/18* (2013.01); *G01S 3/043* (2013.01); *H04B 7/086* (2013.01)

(58) Field of Classification Search
CPC ... G01S 3/74; G01S 3/043; G01S 3/14; G01S 3/46; G01R 23/18
(Continued)

(56) References Cited

U.S. PATENT DOCUMENTS 5,568,154 A * 10/1996 Cohen ...................... G01S 3/74
324/76.77
2013/0252568 A1* 9/2013 Woodsum ................ H04B 1/10
455/296
(Continued)

FOREIGN PATENT DOCUMENTS

FR          3 041 762 A1    3/2017
WO    WO 2007/028278 A1    3/2007

OTHER PUBLICATIONS

French Search Report, from the French Patent Office in counterpart French Application No. 1700615, dated Mar. 8, 2018.
(Continued)

Primary Examiner — Harry K Liu
(74) Attorney, Agent, or Firm — Arent Fox LLP

(57) ABSTRACT

The invention relates to a method and a device for estimating an angle of arrival of an incident radio signal in relation to a predetermined reference direction by using a set of N receiving paths comprising at least one directional antenna pointing in N different receiving directions, wherein only one sub-set of at least two receiving paths with adjacent antenna directions in said set of antennas delivers a measured power at reception.

The device comprises modules suitable for: determining a number of receiving paths delivering a measured power forming said sub-set, and a reference index corresponding to a first receiving path in a direction in which extends the set of antenna directions of said sub-set; selecting the measured powers and obtaining a value to attribute to the non-measured powers to form a completed power signal; by (Continued)

applying a discrete Fourier transform (DFT) to said completed power signal, calculating at least one transformed value among the transformed values corresponding to a first, second, and third frequency line of the DFT; and, using the transformed value(s), applying an estimator of the angle of arrival, depending on the reference index.

13 Claims, 5 Drawing Sheets

(51) Int. Cl.
    *G01S 3/04*     (2006.01)
    *H04B 7/08*     (2006.01)

(58) Field of Classification Search
    USPC ......................................................... 342/417
    See application file for complete search history.

(56) References Cited

U.S. PATENT DOCUMENTS

| | | |
|---|---|---|
| 2014/0159954 A1 | 6/2014 | Stoddard |
| 2017/0195938 A1* | 7/2017 | Gomadam ............. H04B 7/086 |

OTHER PUBLICATIONS

International Search Report and Written Opinion, issued by International Searching Authority in corresponding International Application No. PCT/EP2018/064167, dated Aug. 30, 2018.

Lie, J.P. et al., "Single Antenna Power Measurements Based Direction Finding With Incomplete Spatial Coverage", 2012 IEEE International Conference on Acoustics, Speech and Signal Processing (ICASSP 2012), pp. 2641-2644, (2012).

* cited by examiner

METHOD AND DEVICE FOR ESTIMATING AN ANGLE OF ARRIVAL OF AN INCIDENT RADIO SIGNAL

CROSS-REFERENCE TO RELATED APPLICATIONS

This application is a National Stage Entry of International Patent Application No. PCT/EP2018/064167, filed on May 30, 2018, which claims priority to French Application No. 17 00615, filed on Jun. 9, 2017. The disclosures of the priority applications are incorporated in their entirety herein by reference.

FIELD OF THE INVENTION

The present invention relates to an angle estimation method for estimating an angle of arrival of an incident radio signal in relation to a predetermined reference direction, by using a set of N receiving paths comprising directional antennas pointing in different receiving directions and an angle estimation device for estimating an angle of arrival of an associated incident radio signal.

BACKGROUND OF THE INVENTION

The invention belongs to the field of amplitude goniometry or direction finding, and finds particular application in the detection of radio signals emitted by radars.

The method of the invention is applicable in particular for one-dimensional goniometry or direction finding, for estimating an angle of arrival of an incident radio signal in a plane, by using the power measured by a set of receiving paths each comprising one receiving directional antenna.

The principle applied is the estimation of an angle of arrival, defining a direction of arrival, of a radio signal based on a number N of the powers $x_0, x_1, \ldots, x_{N-1}$ of the signals delivered by N receiving paths with directional antennas respectively pointed in selected directions of the plane of detection, corresponding to angles $\theta_0, \theta_1, \ldots, \theta_{N-1}$ in relation to a predetermined reference direction. The number N a priori is any number, in practice N is in general comprised between 4 and 16.

However, in some cases, the power radiated by an incident radio signal is low, and even using amplifiers in the reception chain between the output of each antenna and the power measurement, it is possible that only L receiving paths with adjacent antennas, forming a sub-set of the N receiving paths, deliver a power greater than or equal to the detection threshold applied.

In fact, when the radiated power is low, only the receiving paths whose antennas have a direction close to the incident direction receive a power greater than the detection threshold, the other powers being lower than this threshold value, will not be measured. In this case, the conventional algorithms for estimating the angle of arrival are found to be ineffective.

An analogous problem arises with the use of down-sampling digital meters in an amplitude goniometer. Indeed, such meters use down-sampling in order to reduce the bit rate and perform a spectral analysis of very broadband instantaneous signals, of the order of several GHz to several tens of GHz, but this leads to spectrum folding in the spectral analysis band. Therefore, the measured frequency is ambiguous and in order to remove the ambiguities, a plurality of digital channels having different frequencies, each including an analogue-to-digital conversion and a spectral analysis, are arranged in parallel. The number of signals present in parallel may then exceed the expected limit. A consequence thereof is the absence of measurement of power on certain receiving paths and some signals.

The object of the invention is to remedy the aforementioned drawbacks.

SUMMARY OF THE INVENTION

To this end, the invention proposes an angle estimation method for estimating an angle of arrival of an incident radio signal in relation to a predetermined reference direction, by using a set of N receiving paths comprising at least one directional antenna pointing in N different receiving directions, wherein only one sub-set of at least two receiving paths with adjacent antenna directions in the said set of antennas delivers a measured power at reception of the said incident radio signal. The method comprises the following steps:

determination of a number of receiving paths delivering a measured power forming the said sub-set, and a reference index corresponding to a first receiving path in a direction in which extends the set of antenna directions of the said sub-set;

selection of the measured powers and obtaining of a value to be attributed to the non-measured powers to form a completed power signal with N samples;

calculation, by applying a discrete Fourier transform to the said completed power signal, of at least one transformed value from among the transformed values corresponding to a first, second, and third frequency line of the discrete Fourier transform, the first frequency line corresponding to the zero frequency;

application of an estimator of the angle of arrival using the calculated transformed value or values, the said estimator being dependent on the said reference index.

Advantageously, the method of the invention makes it possible to improve the accuracy of estimation of the angle of arrival in the case where only one sub-set of at least two receiving paths provides measured powers, by using values attributed to non-measured powers that are optimised in relation to the estimator of the applied angle of arrival.

The angle estimation method for estimating an angle of arrival of a radio signal according to the invention may also have one or more of the following characteristic features, taken into consideration independently or in combination.

The value to be attributed to the non-measured powers is a non-zero value, depending on the indices of the receiving paths of the said sub-set and the corresponding measured powers.

The value to be attributed to the non-measured powers additionally also depends on a measured frequency of the radio signal.

The value to be attributed to the non-measured powers is substantially equal to an average value of N powers obtained from at least one radiation pattern corresponding to the power measured by a receiving path antenna.

A plurality of values to be attributed to the non-measured powers is obtained in advance by calculation or by experimentation, the said values being saved and stored in a table.

In the calculation step, the calculation is performed of the transformed value corresponding to the second frequency line of the discrete Fourier transform, the said transformed value being a complex number defined by a modulus and an argument.

The estimator is a first estimator, the application of the said first estimator comprising of the calculation of the argument of the calculated transformed value and subtraction of the said argument from a reference angle value.

The applying of an estimator makes use of at least one value of transformed coefficient obtained by applying the Fourier transform to a set of coefficients representative of the sub-set of antenna directions delivering a measured power, the said value of transformed coefficient depending on the reference index and the number of receiving paths of the said sub-set.

In the calculation step, additionally the calculation is also performed, of the transformed value corresponding to the first frequency line of the discrete Fourier transform and the said estimator is a second estimator, the application of the said second estimator comprising of the calculation of the argument of a term that is dependent on the transformed values corresponding to the first and to the second frequency lines, the said value to be attributed to the non-measured powers and values of transformed coefficients.

In the calculation step, additionally the calculation is also performed, of the transformed values corresponding respectively to the first and to the third frequency lines of the discrete Fourier transform, and the said estimator is a third estimator, the application of the said third estimator comprising of the calculation of the argument of a term that is dependent on the transformed values corresponding to the first, second, and third frequency lines, the said value attributed to the non-measured powers and values of transformed coefficients.

The value to be attributed to the non-measured powers is equal to zero, and the applying of an estimator makes use of at least one value of transformed coefficient obtained by applying the Fourier transform to a set of coefficients representative of the sub-set of antenna directions delivering a measured power, the said value of transformed coefficient depending on the reference index and the number of receiving paths of the said sub-set.

In the calculation step, additionally the calculation is also performed, of the transformed values corresponding respectively to the second, and to the third frequency lines of the discrete Fourier transform, and the said estimator is a fourth estimator, the application of the said fourth estimator comprising of the calculation of the argument of a term that is dependent on the transformed values corresponding to the second, and third frequency lines and values of transformed coefficients.

According to another aspect, the invention relates to an angle estimation device for estimating an angle of arrival of an incident radio signal in relation to a predetermined reference direction, by using a set of N receiving paths comprising at least one directional antenna pointing in N different receiving directions, wherein only one sub-set of at least two receiving paths with adjacent antenna directions in the said set of antennas delivers a measured power at reception of the said incident radio signal. The device comprises suitable modules that are capable of:
- determining a number of receiving paths delivering a measured power forming the said sub-set, and a reference index corresponding to a first receiving path in a direction in which extends the set of antenna directions of the said sub-set;
- selecting the measured powers and obtaining a value to be attributed to the non-measured powers to form a completed power signal with N samples;
- calculating, by applying a discrete Fourier transform to the said completed power signal, at least one transformed value from among the transformed values corresponding to a first, second, and third frequency line of the discrete Fourier transform, the first frequency line corresponding to the zero frequency;
- applying an estimator of the angle of arrival using the calculated transformed value or values, the said estimator being dependent on the said reference index.

In one embodiment, use is made of a set of N receiving paths each comprising a directional antenna pointing in a different receiving direction, wherein only one sub-set of at least two receiving paths with adjacent antenna directions in the said set of antennas delivers a measured power at reception of the said incident radio signal.

BRIEF DESCRIPTION OF THE DRAWINGS

Other characteristic features and advantages of the invention will clearly emerge from the description which is given here below, for indicative purposes only without intending to be in any way limiting, and with reference to the appended figures, among which.

DETAILED DESCRIPTION OF EMBODIMENTS

Figure 1:
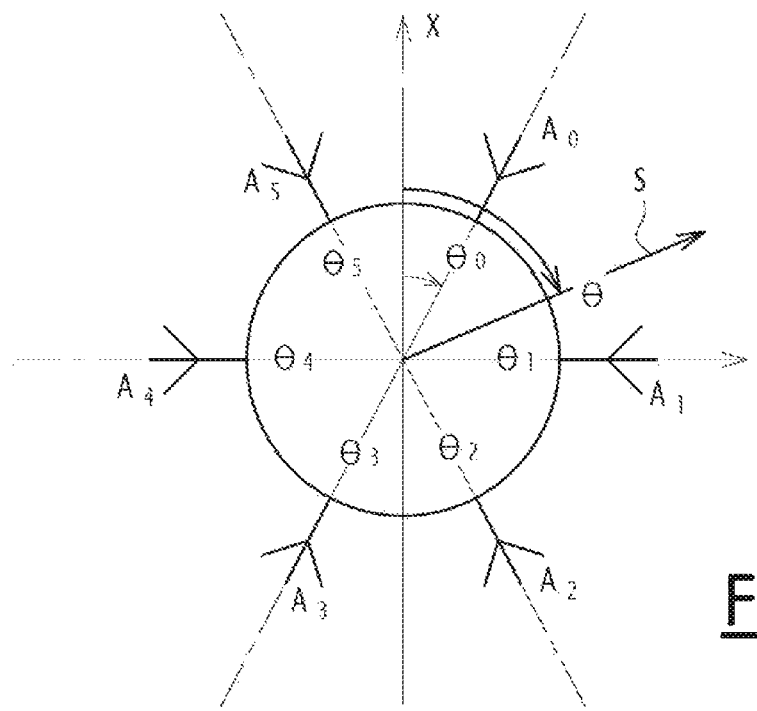
FIG. 1 schematically illustrates a goniometry or direction finding system with N=6 antennas in a plane in which is defined an angle of arrival θ of a radio signal.

FIG. 1 schematically illustrates in a plane a goniometry or direction-finding system with N=6 directional antennas, denoted as $A_0$ to $A_5$, each having an associated pointing direction and forming part of a receiving path as explained here below. Each pointing direction is respectively characterised by an associated angle $\theta_0$ to $\theta_5$, defined in relation to a predetermined reference direction. In the example, the predetermined reference direction is the direction of the X axis of the reference coordinate system (X, Y) of the plane.

In a more general manner, any number N of antennas $A_0, \ldots A_n, \ldots, A_{N-1}$ is considered.

The pointing directions of the antennas are regularly distributed angularly over $\Omega=360°$, the example illustrated in FIG. 1 shows 6 antennas pointed every 60°. In practice, the angular distribution has a tolerance, for example of a few degrees.

Irregular antenna pointing directions do not lend themselves to the use of the Discrete Fourier Transform as described hereinafter. A specific adaptation nevertheless may be envisaged.

In particular, the case considered is that of a slightly uneven distribution over 360°: the N pointing directions of the N antennas correspond to the N regular directions every 360°/N to within an offset, variable from one antenna to another, but not exceeding ±10% of 360°/N. In this case, the generated error is small and is corrected computationally.

In another instance, the particular case considered is that of an incomplete distribution over 360°, for example 4 antennas succeeding each other at 45° intervals. The incident radio signal S of the schematic example shown in FIG. 1 arrives with an angle of arrival θ in relation to the predetermined reference direction.

The antennas $A_0$ to $A_5$ are directional antennas preferably having the same operating characteristic features.

Figure 2:
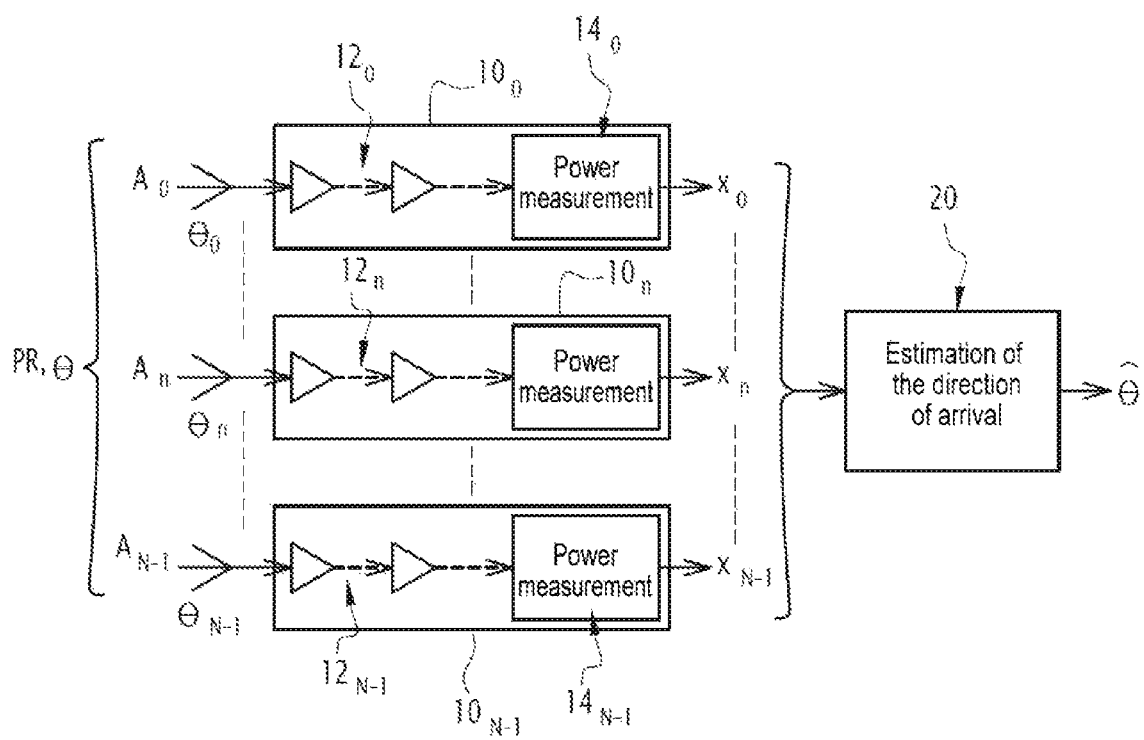
FIG. 2 is a block diagram of a general angle estimation device for estimating an angle of arrival.

Each of the antennas $A_n$ receives a radiated power PR. As illustrated in FIG. 2, each antenna $A_n$ is connected at the input of a power measurement module $10_n$ comprising a reception chain $12_n$ that in particular may comprise amplifiers. The reception chain $12_n$ is followed by a power measurement module $14_n$, that provides in output a measured power $x_n$ when this power is greater than a predetermined detection threshold value.

The assembly formed by an antenna $A_n$ and the corresponding power measurement module $10_n$ forms a receiving path, which either delivers or does not deliver a measured power.

The detection threshold is linked to the noise power at the end of the reception chain and is selected in a conventional manner, for the quality of detection with probabilities of false alarm and detection or for the accuracy of the measurements to be carried out, for example it is often comprised between 16 and 24 dB.

The measured powers $x_0, x_1, \ldots, x_{N-1}$ are provided to a direction estimating module 20 for estimating the direction of arrival, which operationally implements the various embodiments of the method of the invention.

The invention is applicable in particular in the specific case where only one sub-set of L receiving paths, with L>1, comprising adjacent antennas among the N receiving paths provides a measured power, while N-L receiving paths do not provide measured power.

For example, in FIG. 1, only the receiving paths of the antennas $A_5$, $A_0$, $A_1$ and $A_2$ provide a measured power value $x_5, x_0, x_1, x_2$, with the receiving paths of the antennas $A_3$ and $A_4$ not providing measured power. In this case, N=6, L=4.

The direction estimation module 20 for estimating the direction of arrival is adapted so as to calculate an angle value $\hat{\theta}$ which is an estimate of the value of the angle of incidence θ of the incident radio signal S.

The direction estimation module 20 for estimating the direction of arrival is for example operationally implemented by a programmable device, comprising one or more processors, with the ability to execute instructions of executable code when the programmable device is powered up, and a data storage module, in particular for instructions of executable code. According to one variant embodiment, the programmable device that operationally implements the module 20 is designed and produced in the form of a programmed card of the Application Specific Integrated Circuit (ASIC) or Field Programmable Gate Arrays (FPGA) type.

It should be noted that in theory, when all N receiving antennas $A_n$ provide a measured power, the angle of arrival of the incident radio signal can be estimated as follows:

$$\hat{\theta} = \text{Arctg}\left(\frac{\sum_{n=0}^{N-1} x_n \cdot \sin\theta_n}{\sum_{n=0}^{N-1} x_n \cdot \cos\theta_n}\right) = \text{Arg}\left(\sum_{n=0}^{N-1} x_n \cdot e^{i\theta_n}\right) \quad \text{(eq 1)}$$

where Arctg( ) is the trigonometric arc tangent function, and Arg( ) is the argument of a complex number, and $e^{i\theta_n}$ is the complex number of argument $\theta_n$ and module 1.

The receiving antennas have uniformly distributed directions over the expression written as follows:

$$\theta_n = \theta_0 + n\frac{2\pi}{N} \quad \text{(eq 2)}$$

By combining the equations (eq 1) and (eq 2) the following is obtained:

$$\hat{\theta} = \text{Arg}\left(\sum_{n=0}^{N-1} x_n \cdot e^{i(\theta_0 + n\frac{2\pi}{N})}\right) = \theta_0 + \text{Arg}\left(\sum_{n=0}^{N-1} x_n \cdot e^{i\frac{2\pi}{N}}\right) \quad \text{(eq 3)}$$

The discrete Fourier transform of the signal $x_0, x_1, \ldots, x_{N-1}$, for a frequency line of frequency index k comprised between 0 and N-1, is written as follows:

$$X_k = \sum_{n=0}^{N-1} x_n \cdot e^{-i\frac{2\pi}{N}kn} \quad \text{(eq 4)}$$

The discrete Fourier transform provides transformed values corresponding to N frequency lines, the first frequency line corresponding to the frequency index 0, the second frequency line to the frequency index 1, the third frequency line to the frequency index 2 and more generally, the kth frequency line corresponds to the frequency index k-1.

From a signal, $x_0, x_1, \ldots, x_{N-1}$ a transformed value $X_k$ is obtained for each frequency line of index k.

The equation (eq 3) is written as a function of the discrete Fourier transform for the frequency line of frequency index k=1:

$$\hat{\theta} = \theta_0 - \text{Arg}(X_1) \quad \text{(eq 5)}$$

The theoretical estimator of the angle of arrival is given by the formula (eq 5) here above. The angle $\theta_0$ is used as the reference angle, and this is the angle formed by the direction of the first antenna of the set of antennas with the reference direction.

However, the invention is positioned within the context where the signal $x_0, x_1, \ldots, x_{N-1}$ is fragmented, with only one sub-set of measured powers being available.

In this context L denotes the number of adjacent antennas delivering a measured power, and P denotes the index of the first antenna of the subassembly in a direction in which extends the set of antennas, for example in the clockwise direction. The index P is referred to as the reference index.

The sub-set of antennas that provide a measured power is then formed of the antennas with indices:

I={P, (P+1)mod N, . . . , (P+L-1)mod N} where mod denotes the modulo operator.

Again taking up the example discussed here above with reference to FIG. 1, when only the antennas $A_5$, $A_0$, $A_1$ and $A_2$ provide a measured power value, L=4 and I={5,0,1,2}.

Figure 3:
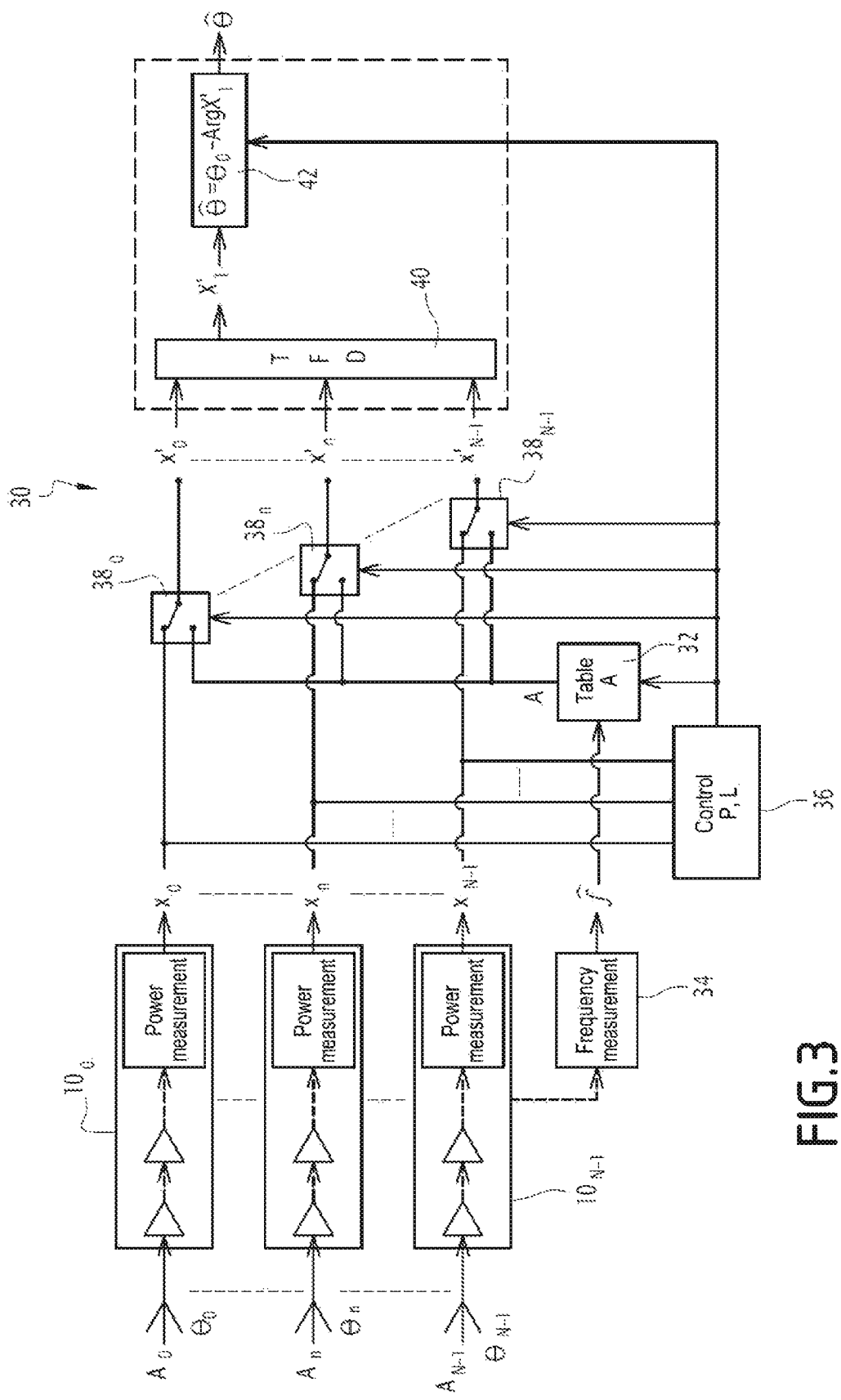
FIG. 3 is a block diagram of an angle estimation device for estimating an angle of arrival that operationally implements an angle estimation method for estimating an angle of arrival according to a first embodiment.

FIG. 3 schematically illustrates an angle estimation device 30 for estimating an angle of arrival according to a first embodiment, that operationally implements a first embodiment of the angle estimation method for estimating an angle of arrival.

In this first embodiment of the invention, a non-zero value A is attributed to the non-measured powers.

The value A, to be attributed to the non-measured powers, is read in a table 32, and it is substantially equal to the average power value, in linear unit, which would have been obtained if the N powers could have been measured on each antenna.

The table 32 of the values to be attributed to the non-measured powers is constructed in advance and saved and stored, as explained in greater detail here below, during a preliminary calculation step of calculating the table of values to be attributed to the non-measured powers, according to the radiation pattern of each antenna of the set of antennas.

The value A to be attributed to the non-measured powers is determined as a function of the values of measured powers and associated indices, as well as of an estimated frequency value $\hat{f}$, in such a manner as to make it possible to process a wide frequency band, typically of several octaves.

The frequency of the incident radio signal is estimated by a frequency estimation module 34, according to the principles and methods known in the state of the art, on the basis of the type of receivers, whether digital or analogue, used.

In this first embodiment of the invention, the angle estimation method for estimating an angle of arrival of an incident radio signal operationally implements a control module 36 which determines the index P of the first antenna in the direction of antenna extension delivering a measured power, and the number L.

The control module 36 controls the selection, by the selectors $38_i$, of the corresponding power values, $\{x_P, x_{(P+1) \bmod N}, \ldots, x_{(P+L-1) \bmod N}\}$ for transmission at the input of a discrete Fourier transform calculation module 40.

The corresponding powers at the input of the discrete Fourier transform module 40 are denoted as $\{x'_P, x'_{(P+1) \bmod N}, \ldots, x'_{(P+L-1) \bmod N}\}$.

The control module 36 commands the selection of the value to be attributed to the non-measured powers A read in the table 32, as a function of the frequency value estimated by the module 34, $\hat{f}$, the indices P, ... (P+L−1)mod N of the measured powers and corresponding measured powers.

The values of the non-measured power are set to the value A:

$$x'_j = A(\hat{f}, P, x_P, (P+1) \bmod N, x_{(P+1) \bmod N}, \ldots, (P+L-1) \bmod N, x_{(P+L-1) \bmod N}) j \notin I \quad (eq\ 6)$$

In a simplified variant embodiment, even if the number L is greater than 2, the value A is selected only as a function of the indices P and (P+1)mod N and the corresponding powers $x_P$ and $x_{(P+1) \bmod N}$.

Thus, at the conclusion of the steps implemented by the control module 36, a completed power signal $\{x'_0, x'_1, \ldots, x'_{N-1}\}$ is provided at the input of the calculation module of the Fourier transform 40.

The module 40 operationally executes the calculation of a transformed value corresponding to the frequency line of frequency index k=1, according to the following formula:

$$X'_1 = \sum_{n=0}^{N-1} x'_n \cdot e^{-i\frac{2\pi}{N} n} \quad (eq\ 7)$$

Then the module 42 for implementing an angle of arrival estimator proceeds to apply the following first estimator:

$$\hat{\theta} = \theta_0 - \text{Arg} X'_1 \quad (eq\ 8)$$

This first estimator provides a result that is substantially equivalent to the result provided by the theoretical estimator applicable when the N receiving paths provide the measured powers, by using the transformed value $X_1'$ with index 1 in the Fourier domain.

The formula (eq 8) of the first estimator is obtained as explained here below.

In effect, if one were to introduce in the calculations a multiplier coefficient $c_n(P,L)$, representative of the sub-set of antennas delivering a measured power, equal to 1 for the indices $n \in I$ for which the receiving paths with adjacent antennas delivering a measured power, and 0 otherwise, the completed power signal can be written as follows:

$$x'_n = x_n \cdot c_n(P,L) + y_n \cdot (1 - c_n(P,L)) \text{ for } n \in \{0, \ldots, N-1\} \quad (eq\ 9)$$

With $y_n = A$ for all index n.

In the domain of the Fourier transform:

$$X'_k = Y_k + (K_k - Y_k) \otimes C_k(P,L) \quad (eq\ 10)$$

Where $\otimes$ denotes the circular convolution operation, $X_k, Y_k, C_k(P,L)$ respectively are discrete Fourier transforms of index k of the discrete signals $x_n, y_n, c_n(P,L)$.

When it is decided to attribute the constant value A to the non-measured powers, the values transformed by the Fourier transform corresponding to $\{y_n = A, 0 \leq N < N\}$ are:

$Y_0 = N \cdot A$ and $Y_m = 0$ for $m = 1, 2, \ldots, N-1$.

Then, for k=1 the following are obtained:

$$X'_1 = (X_0 - Y_0) \cdot C_1 + C_0 + X_2 \cdot C_{N-1} + \ldots + X_{N-2} \cdot C_3 + X_{N-1} \cdot C_2 \quad (eq\ 11)$$

It should be noted that in order to simplify the notations, the $C_k(P,L)$ has been replaced by $C_k$ in the formula here above.

Since the values of the coefficients $c_n(P,L)$ are real values, the values transformed by the discrete Fourier transform satisfy the following relation:

$$C_{N-k}(P,L) = C_k^*(P,L) \quad (eq\ 12)$$

Where $C_k^*(P,L)$ denotes the conjugate of $C_k(P,L)$, that is to say the complex number having the same modulus and argument with the opposite sign.

In addition, the values of power $x_n$ are real numbers, thus an analogous relationship is applicable: $X_{N-k} = X_k^*$.

The formula (eq 11) is therefore written, by using the conjugates:

$$X'_1 = (X_0 - Y_0) \cdot C_1 + X_1 \cdot C_0 + X_2 \cdot C_1^* + X_3 \cdot C_2^* + \ldots + X_2^* \cdot C_3 + X_1^* \cdot C_2 \quad (eq\ 13)$$

Here the rank of a term comprising a multiplication of elementary terms is referred to as the sum of the indices of the elementary terms concerned.

By simplifying the terms with rank greater than or equal to 3 in the formula (eq 13) here above the following is obtained:

$$X'_1 \approx (X_0 - Y_0) \cdot C_1 + X_1 \cdot C_0 \quad (eq\ 14)$$

The value A is substantially equal to the average of the powers $x_n$:

$$A \approx \frac{X_0}{N}$$

Consequently, since $Y_0 = N \cdot A$, it therefore results in: $Y_0 \approx X_0$ The relation (eq 14) is transformed, for the value of A chosen, into:

$$X'_1 \approx X_1 \cdot C_0 \quad (eq\ 15)$$

And $C_0=L$ which is real, therefore $\text{Arg}(X_1')\approx\text{Arg}(X_1)$

In other words, thanks to the choice of the value attributed to the non-measured powers, the argument of the value transformed by discrete Fourier transform for the frequency index 1 is substantially equal to the argument of the transformed value of the complete power signal, which is not accessible by measurement.

Figure 4:
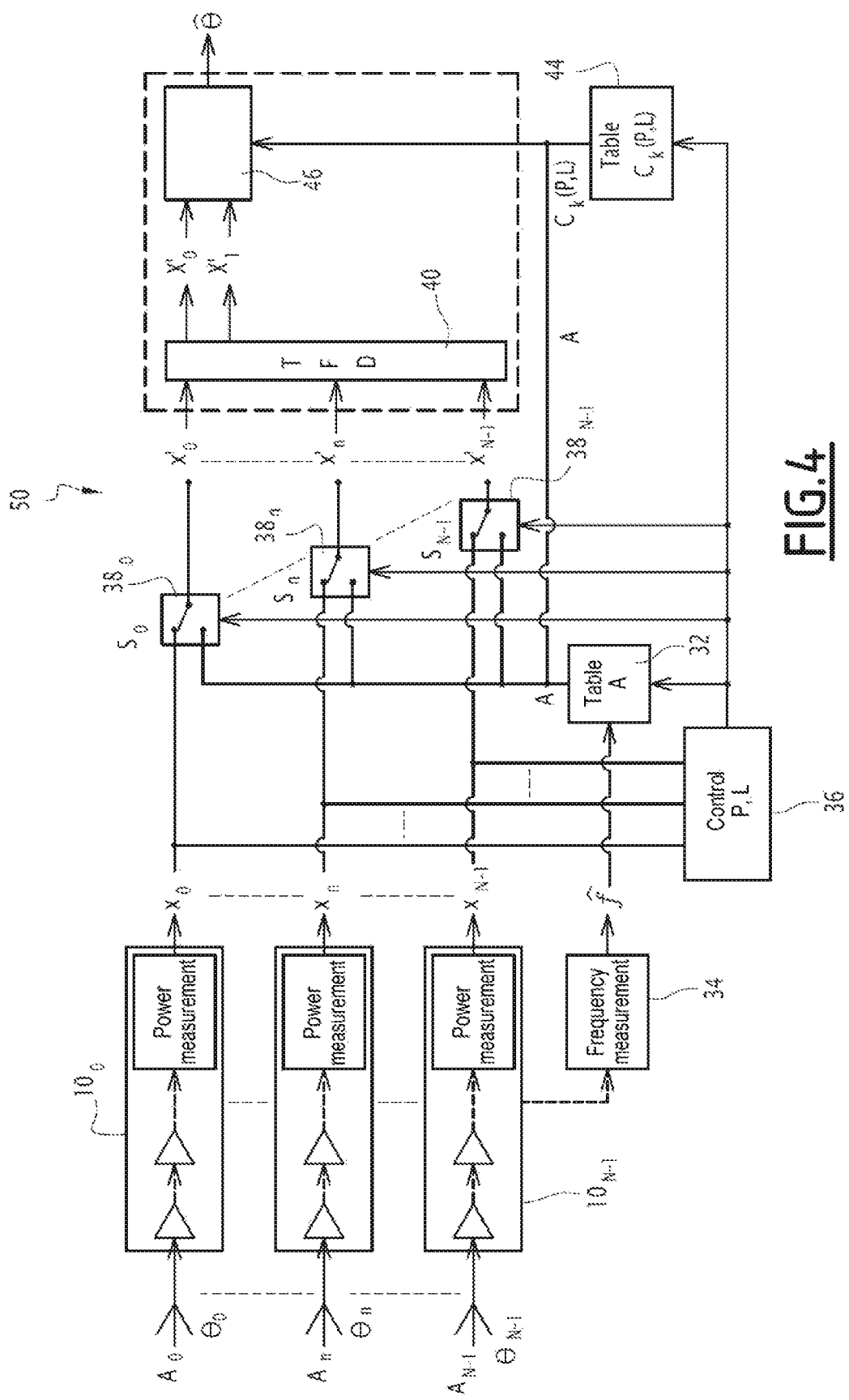
FIG. 4 is a block diagram of an angle estimation device for estimating an angle of arrival that operationally implements an angle estimation method for estimating an angle of arrival according to a second embodiment.

FIG. 4 schematically illustrates an angle estimation device 50 for estimating an angle of arrival according to a second embodiment, which operationally implements a second embodiment of the angle estimation method for estimating a corresponding angle of arrival.

In this second embodiment of the invention also the same non-zero value A is attributed to the missing powers. As in the first embodiment, the value A is a function of the estimated frequency value $\hat{f}$ and the indices P, ..., (P+L−1) mod N and corresponding powers.

The frequency estimation modules 34 for estimating the frequency of the incident radio signal, the modules for control 36, and selection 38₀, as well as the table 32 that saves and stores the values to be attributed to the missing powers are analogous to the modules described here above with reference to FIG. 4.

In addition to the value transformed in the Fourier domain for the frequency index 1, the second estimator, operationally implemented by the estimation module 46 also uses the transformed value $X_0'$ corresponding to the frequency line of frequency index k=0.

The transformed value $X_0'$ is calculated by the Fourier transform application module for applying the discrete Fourier transform 40:

$$X_0' = \sum_{n=0}^{N-1} x_n' \quad\quad (\text{eq 16})$$

In addition, the second estimator uses the values of transformed coefficients $C_k(P,L)$ obtained by applying a discrete Fourier transform to the discrete signal formed by the coefficients $c_n(P,L)$.

Preferably, in order to optimise the calculations, the values of transformed coefficients $C_k(P,L)$ are calculated in advance and saved and stored in a table 44.

The second estimator applied is calculated by means of the following formula:

$$\hat{\theta} = \theta_0 + \text{Arg}\left(\frac{(X_0' - N\cdot A)\cdot C_0(P,L) - X_1'\cdot C_1^*(P,L)}{C_1(P,L)}\right) \quad (\text{eq 17})$$

Where A is the value to be attributed to the non-measured powers read in table 32, the values of transformed coefficients $C_0(P,L), C_1(P,L), C_1^*(P,L)$ are read from the table 44.

It should be noted that $C_0(P,L)=L$.

The second estimator is obtained by using a system of equations that bring into play the transformed values $X_0'$ and $X_1'$, and by ignoring the terms with rank greater than or equal to 3.

Indeed, by applying the formulas (eq 10) and (eq 12), by replacing the $C_k(P,L)$ by $C_k$ in order to simplify the expressions, the following is obtained:

$$X_0' - Y_0 = (X_0 - Y_0)\cdot C_0 + X_1\cdot C_1^* + X_2\cdot C_2^* + X_3\cdot C_3^* + \ldots + X_2^*\cdot C_2 + X_1^*\cdot C_1 \quad (\text{eq 18})$$

As well as the formula (eq 13) restated here below:

$$X_1' = (X_0 - Y_0)\cdot C_1 + X_1\cdot C_0 + X_2\cdot C_1^* + X_3\cdot C_2^* + \ldots + X_2^*\cdot C_3 + X_1^*\cdot C_2 \quad (\text{eq 13})$$

By simplifying the terms with rank greater than or equal to 3 in these equations the following is obtained:

$$X_0' - Y_0 \approx (X_0 - Y_0)\cdot C_0 + X_1\cdot C_1^* + X_1^*\cdot C_1 \quad (\text{eq 19})$$

As well as the simplification of $X_1'$ analogous to the first embodiment:

$$X_1' \approx (X_0 - Y_0)\cdot C_1 + X_1\cdot C_0 \quad (\text{eq 14})$$

It is possible to derive therefrom:

$$X_1^* \approx \frac{(X_0' - Y_0)\cdot C_0 - X_1'\cdot C_1^* - (C_0^2 - |C_1|^2)\cdot (X_0 - Y_0)}{C_0\cdot C_1} \quad (\text{eq 20})$$

However the selection of the value A to be attributed to the non-measured powers resulting in $Y_0 = N\cdot A = X_0$, makes it possible to simplify the expression of (eq 20) here above, and in addition $C_0(P,L)=L$ is real, which makes it possible to obtain:

$$\text{Arg}(X_1) = -\text{Arg}(X_1^*) \approx -\text{Arg}\left(\frac{(X_0' - Y_0)\cdot C_0 - X_1'\cdot C_1^*}{C_1}\right) \quad (\text{eq 21})$$

The second estimator refines the first estimator, however the computational complexity is slightly increased.

Figure 5:
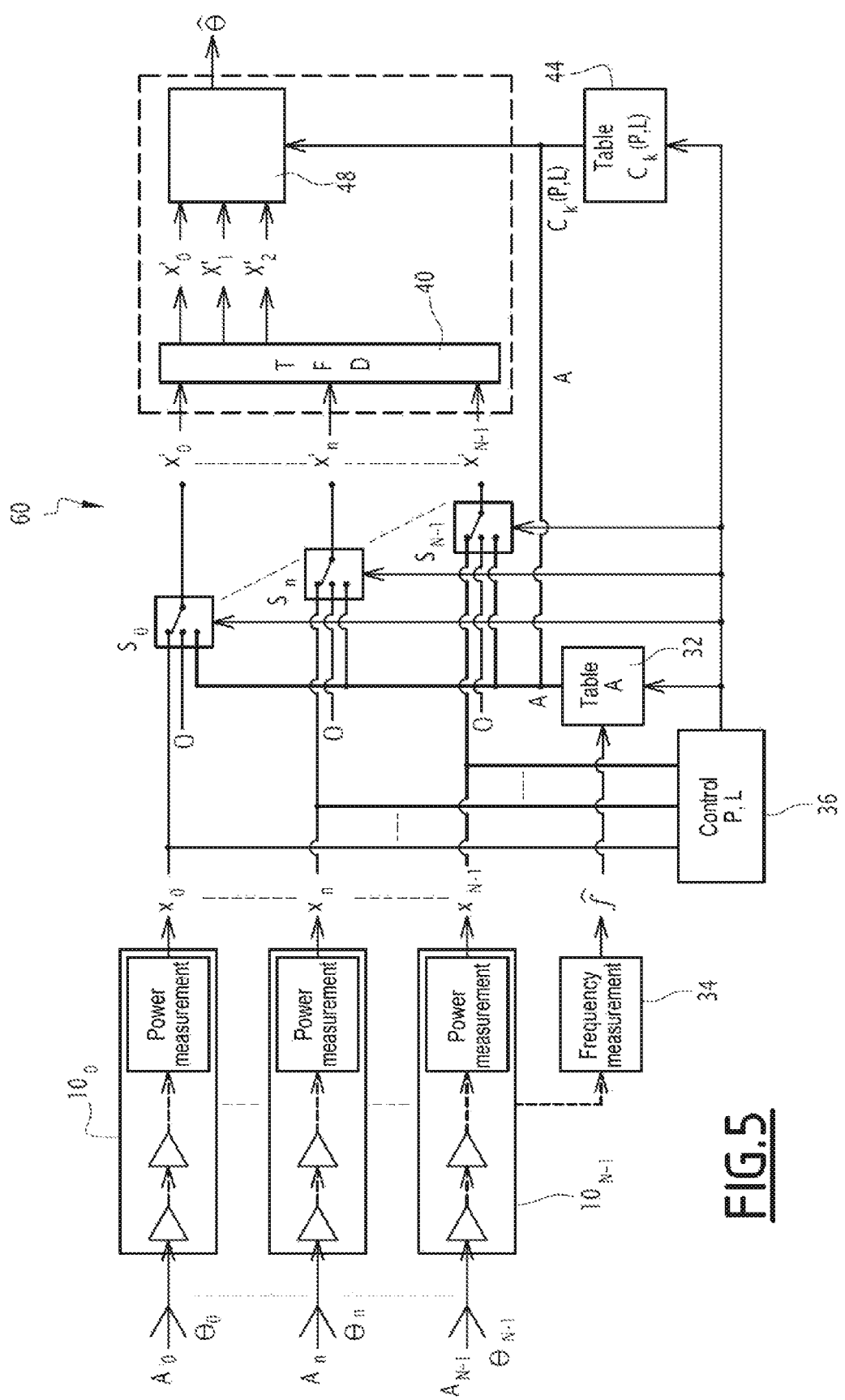
FIG. 5 is a block diagram of an angle estimation device for estimating an angle of arrival that operationally implements an angle estimation method for estimating an angle of arrival according to a third embodiment.

FIG. 5 schematically illustrates an angle estimation device 60 for estimating an angle of arrival according to a third embodiment, which operationally implements a third embodiment of the angle estimation method for estimating a corresponding angle of arrival.

In this third embodiment of the invention also the non-zero value A is attributed to the missing powers.

The frequency estimation modules 34 for estimating the frequency of the incident radio signal, the modules for control 36, and selection $38_n$, as well as the table 32 that saves and stores the values to be attributed to the non-measured powers are analogous to the modules described here above with reference to FIG. 4.

In addition to the values transformed in the Fourier domain for the frequency indices 0 and 1, the third estimator, operationally implemented by the estimation module 48, also uses the transformed value $X_2'$, corresponding to the third frequency line.

The transformed value $X_2'$ is calculated by the Fourier transform application module for applying the discrete Fourier transform 40:

$$X_2' = \sum_{n=0}^{N-1} x_n'\cdot e^{-i\frac{2\pi}{N}2n} \quad (\text{eq 22})$$

As in the previous embodiment, the third estimator uses the values of transformed coefficients $C_k(P,L)$, obtained by applying a discrete Fourier transform to the discrete signal formed by the coefficients $c_n(P,L)$, saved and stored in advance in a table 44.

The estimation module 48 operationally implements the third estimator, that is calculated by means of the following formula, in which the $C_k(P,L)$ have been replaced by the $C_k$ for purposes of simplification of the writing $$\hat{\theta} = \theta_0 - \text{Arg}\left(\frac{(X'_0 - N \cdot A) \cdot C_0 \cdot C_2 - X'_1 \cdot C_0 \cdot C_1 + X'_2 \cdot |C_1|^2}{C_0 \cdot C_1^* \cdot C_2 - C_0^2 \cdot C_1 + C_1 \cdot |C_1|^2}\right) \quad \text{(eq 23)}$$

Where A is the value read from the table 32, the transformed coefficients $C_0, C_1, C_1^*, C_2$ are read from the table 44. As previously noted above, $C_0(P,L) = L$.

The third estimator is obtained by using a system of equations that bring into play the transformed values, $X_0'$, $X_1'$, $X_2'$, and by ignoring the terms with rank greater than or equal to 4.

The third estimator refines the first and second estimators, however with the computational complexity also increased.

For the three embodiments described here above, the table 32 saves and stores the values to be attributed to the non-measured powers, as a function of an estimated frequency value, the indices P, . . . , (P+L−1) mod N of the measured powers and the corresponding measured powers $x_P, \ldots, x_{(P+L-1) \mod N}$.

The value to be attributed to the non-measured powers A is calculated, in a preliminary calculation step, based on a radiation pattern by applying the arithmetic mean, from the power values in linear units, for example in milliwatts.

The determination of each value A to be saved and stored can be carried out by calculation or by experimentation.

The characteristic features of antennas change as a function of frequency, thus, when working in a wide frequency band, the estimated frequency makes it possible to obtain the curves corresponding to the antenna patterns at the different frequencies.

Each index n of measured power corresponds to an antenna $A_n$ and an orientation angle $\theta_n$.

The radiation pattern at the measured frequency is placed in a power-angle of arrival reference frame in a manner such that the angular range around the vertex (maximum gain), which can correspond to the points of measured power, passes most precisely through these points. This radiation pattern, thus placed in power (ordinate) and angle of arrival (abscissa), becomes the pattern of the powers delivered by the set of all the antennas. It is deduced therefrom that the non-measured powers are those from this pattern placed, at the pointing angles of the antennas for which no power is measured.

Thus is obtained a complete set of powers, both measured and deduced, from which it will be possible to derive the arithmetic mean value A, the powers being expressed in linear units.

The table A is filled, in this preliminary calculation phase, for frequency ranges, and ranges of measured power values.

Advantageously, thanks to the saving and storage in advance of values attributable to non-measured powers in the table in a prior phase, the effective direction estimation phase of estimating the direction of an angle of arrival is computationally efficient.

Figure 6:
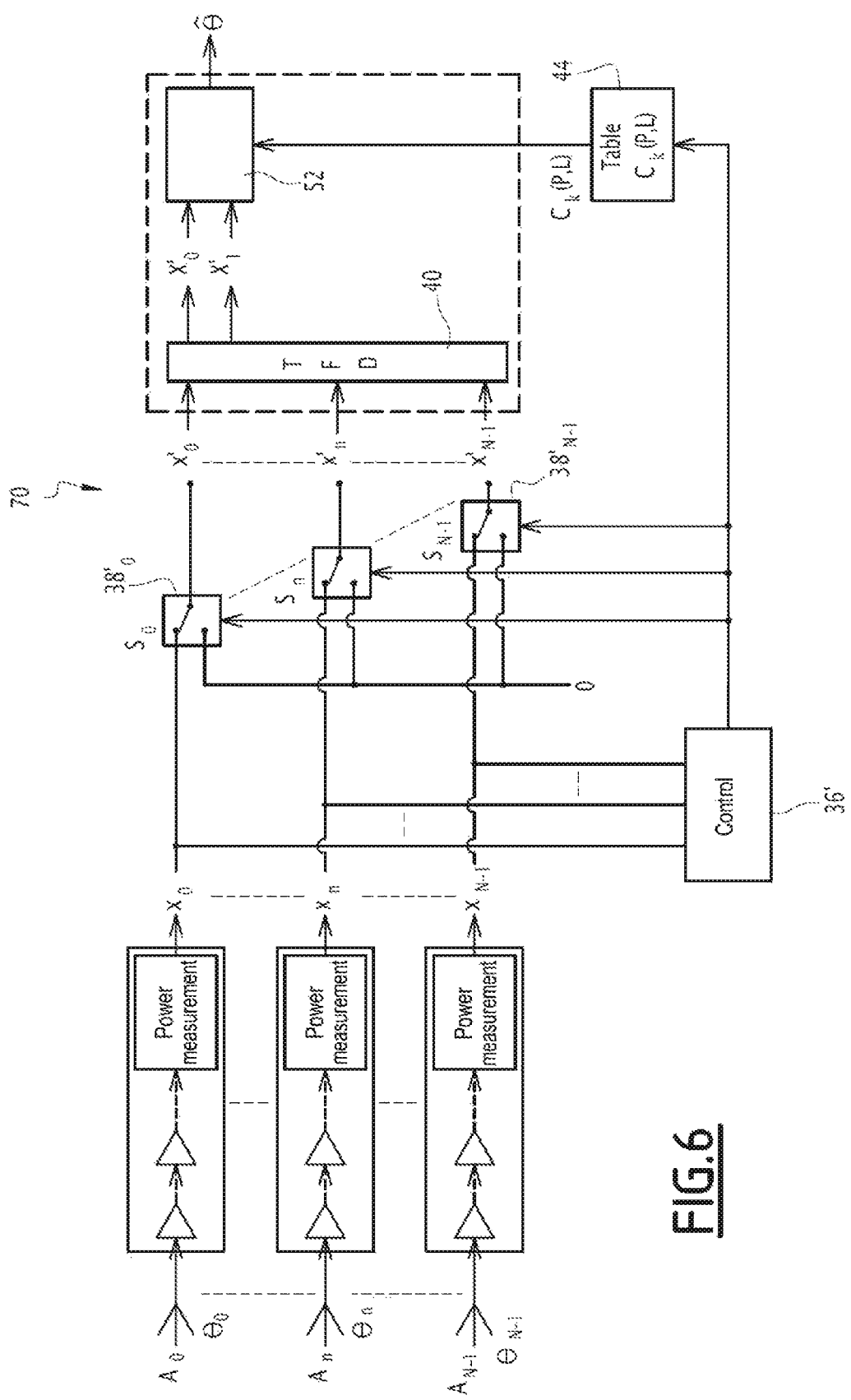
FIG. 6 is a block diagram of an angle estimation device for estimating an angle of arrival that operationally implements an angle estimation method for estimating an angle of arrival according to a fourth embodiment.

FIG. 6 schematically illustrates an angle estimation device 70 for estimating an angle of arrival according to a fourth embodiment, which operationally implements a fourth embodiment of the angle estimation method for estimating a corresponding angle of arrival.

In this fourth embodiment, the device 70 operationally implements a control module 36' for controlling the selectors $38'_n$, which select as power $x_n'$ either the measured power value $x_n$ or the value zero if the power is not measured.

Unlike the first three embodiments, the fourth embodiment does not use an estimated frequency value $\hat{f}$, or a values storage table 32 for saving and storing the values to be attributed to the non-measured powers which are calculated in advance.

The values storage table 44 for saving and storing the transformed coefficients $C_k(P,L)$ is used, as well as the transformed values $X_1'$ and $X_2'$ obtained by applying the discrete Fourier transform for the second, and third frequency lines.

In this fourth embodiment, the control module 36' determines the reference index P and the indices I={P, (P+1)mod N, . . . , (P+L−1)mod N} of the L adjacent antennas delivering a measured power.

The control module 36' controls the selection, by the selectors 380, of the corresponding power values $\{x_P, x_{(P+1) \mod N}, \ldots, x_{(P+L-1) \mod N}\}$ for transmission at the input of a discrete Fourier transform calculation module 40.

The corresponding powers at the input of the discrete Fourier transform module 40 are denoted as $\{x'_P, x'_{(P+1) \mod N}, \ldots, x'_{(P+L-1) \mod N}\}$.

The control module 36' commands the selection of the value zero for the values of non-measured power:

$$x'_j = 0, j \notin I \quad \text{(eq 24)}$$

Thus, at the conclusion of the steps effectively implemented by the control module 36', the completed power signal $\{x'_0, x'_1, \ldots, x'_{N-1}\}$ is provided at the input of the Fourier transform calculation module 40.

The transformed values $X_1'$ and $X_2'$ are calculated.

The estimation module 52 operationally implements the fourth estimator that is calculated by using the following formula, with the notations of the transform coefficients $C_k(P,L)$ simplified:

$$\hat{\theta} = \theta_0 - \text{Arg}\left(\frac{X'_1 \cdot C_2 - X'_2 \cdot C_1}{C_0 \cdot C_2 - C_1^2}\right) \quad \text{(eq 25)}$$

Indeed, by applying the formulas (eq 10) and (eq 12), by replacing the $C_k(P,L)$ by $C_k$ in order to simplify the expressions, the following are obtained:

$$X_1' = (X_0 - Y_0) \cdot C_1 + X_1 \cdot C_0 + X_2 \cdot C_1^* + X_3 \cdot C_2^* + \ldots + X_2^* \cdot C_3 + X_1^* \cdot C_2 \quad \text{(eq 13)}$$

$$X_2' = (X_0 - Y_0) \cdot C_2 + X_1 \cdot C_1 + X_2 \cdot C_0^* + X_3 \cdot C_1^* + \ldots + X_2^* \cdot C_4 + X_1^* \cdot C_3 \quad \text{(eq 26)}$$

The fourth estimator is obtained by using a system of equations that bring into play the transformed values $X_1'$ and $X_2'$, and by ignoring the terms with rank greater than or equal to 3, as well as the term $X_2$, which makes it possible to obtain:

$$X_1' \approx (X_0 - Y_0) \cdot C_1 + X_1 \cdot C_0 \quad \text{(eq 14)}$$

$$X_2' \approx (X_0 - Y_0) \cdot C_2 + X_1 \cdot C_1 \quad \text{(eq 27)}$$

The following is deduced therefrom:

$$X_1' \approx \frac{X_1' \cdot C_2 - X_2' \cdot C_1}{C_0 \cdot C_2 - C_1^2} \quad \text{(eq 28)}$$

The fourth estimator is an alternative estimator, with computational cost similar to that of the second estimator.

As has already been explained, the various embodiments of the invention are applicable as soon as the number L of adjacent receiving paths delivering a measured power is greater than or equal to 2.

In a fifth embodiment of the invention, the method comprises a step of checking and verification of the number L of receiving paths delivering a measured power.

If L is greater than 1 and less than 4, one of the estimators from the first, second, third or fourth estimators described here above is applied.

If L is equal to 4, the first estimator described here above is applied.

If L is strictly greater than 4, the value 0 is attributed to the missing values, instead of the value A, and the first estimator according to the formula (eq 8) is applied.

It should be noted that the case wherein the sub-set of antennas delivering a measured power is reduced to a single antenna, that is to say L=1, is not considered here because the information pertaining to received power is considered insufficient for developing a reliable estimate of the direction of arrival of the incident signal.

The invention has been described here in an exemplary application with a wide frequency band, typically of several octaves. In certain applications the frequency band processed is narrower. In this case, it is not necessary to perform an estimate of the frequency, and the values to be attributed to the non-measured frequencies do not depend on the estimated frequency.

Advantageously, the invention makes it possible to improve the estimation of an angle of arrival of an incident radio signal, in the case where certain receiving paths do not provide measured power, while at the same time having at least two measurements of power.

Advantageously, the preliminary calculation and the saving and storing of values that are useful for calculating the estimators make it possible to optimise the time of calculation of an estimated angle of arrival.

Advantageously, the use of a value to be attributed to the non-measured powers substantially equal to the average power value which would have been obtained if the N powers could be measured on each antenna makes it possible to optimise the estimators according to the first three embodiments while also limiting the necessary storage space.

The invention has been described here above in goniometry or direction-finding systems with N directional antennas distributed along N different pointing directions. By way of a variant, the invention is applicable in an analogous manner in goniometry systems comprising a rotary antenna, adapted so as to point successively in N directions in a direction of angular extension of the given pointing directions.

The invention claimed is:

1. An angle estimation method for estimating an angle of arrival of an incident radio signal in relation to a predetermined reference direction, by using a set of N receiving paths comprising at least one directional antenna pointing in N different receiving directions, wherein only a sub-set of at least two receiving paths with adjacent antenna directions in the set of antennas delivers a measured power at reception of the incident radio signal, the method comprising:
   determining a number of receiving paths delivering a measured power forming the sub-set, and a reference index corresponding to a first receiving path in a direction in which extends the set of antenna directions of the sub-set;
   selecting the measured powers and obtaining of a value to be attributed to the non-measured powers to form a completed power signal with N samples;
   calculating, by applying a discrete Fourier transform to the completed power signal, least one transformed value from among the transformed values corresponding to a first, second, and third frequency line of the discrete Fourier transform, the first frequency line corresponding to the zero frequency; and
   applying an estimator of the angle of arrival using the calculated transformed value or values, the estimator being dependent on the reference index.

2. An angle estimation method according to claim 1, wherein the value to be attributed to the non-measured powers is a non-zero value, depending on the indices of the receiving paths of the sub-set and the corresponding measured powers.

3. An angle estimation method according to claim 2, wherein the value to be attributed to the non-measured powers further depends on a measured frequency of the radio signal.

4. An angle estimation method according to claim 2, wherein the value to be attributed to the non-measured powers is, substantially equal to an average value of N powers obtained from at least one radiation pattern corresponding to the power measured by a receiving path antenna.

5. An angle estimation method according to claim 2, wherein a plurality of values to be attributed to the non-measured powers is obtained in advance by calculation or by experimentation, the values being stored in a table.

6. An angle estimation method according to claim 2, wherein in the calculation step, the calculation is performed of the transformed value corresponding to the second frequency line of the discrete Fourier transform, the transformed value being a complex number defined by a modulus and an argument.

7. An angle estimation method according to claim 6, wherein the estimator is a first estimator, the application of the first estimator comprising the calculation of the argument of the calculated transformed value and subtraction of the argument from a reference angle value.

8. An angle estimation method according to claim 6, wherein the applying of an estimator makes use of at least one value of transformed coefficient obtained by applying the Fourier transform to a set of coefficients representative of the sub-set of antenna directions delivering a measured power,
   the value of transformed coefficient depending on the reference index and the number of receiving paths of the sub-set.

9. An angle estimation method according to claim 8, wherein the calculation step additionally the calculation is also performed, of the transformed value corresponding to the first frequency line of the discrete Fourier transform,
   and wherein the estimator is a second estimator, the application of the second estimator comprising the calculation of the argument of a term that is dependent on the transformed values corresponding to the first and to the second frequency lines, on the value to be attributed to the non-measured powers and on values of transformed coefficients.

10. An angle estimation method according to claim 8, wherein the calculation step further comprises the calculation of the transformed values corresponding respectively to the first and to the third frequency lines of the discrete Fourier transform,
   and wherein the estimator is a third estimator, the application of the third estimator comprising the calculation of the argument of a term that is dependent on the transformed values corresponding to the first, second, and third frequency lines, on the value attributed to the non-measured powers and on values of transformed coefficients.

11. An angle estimation method according to claim 1, wherein the value to be attributed to the non-measured powers is equal to zero, and wherein the applying of an estimator makes use of at least one value of transformed coefficient obtained by applying the Fourier transform to a set of coefficients representative of the sub-set of antenna directions delivering a measured power, the value of transformed coefficient depending on the reference index and on the number of receiving paths of the sub-set.

12. An angle estimation method according to claim 11, wherein the calculation step further comprises the calculation of the transformed values corresponding respectively to the second, and to the third frequency lines of the discrete Fourier transform, and wherein the estimator is a fourth estimator, the application of the fourth estimator comprising the calculation of the argument of a term that is dependent on the transformed values corresponding to the second and third frequency lines and on values of transformed coefficients.

13. An angle estimation device for estimating an angle of arrival of an incident radio signal in relation to a predetermined reference direction, by using a set of N receiving paths comprising at least one directional antenna pointing in N different receiving directions, wherein only a sub-set of at least two receiving paths with adjacent antenna directions in the set of antennas delivers a measured power at reception of the incident radio signal, further comprising modules configured to:

determine a number of receiving paths delivering a measured power forming the sub-set, and a reference index corresponding to a first receiving path in a direction in which extends the set of antenna directions of the sub-set, select the measured powers and obtain a value to be attributed to the non-measured powers to form a completed power signal with N samples, calculate, by applying a discrete Fourier transform to the completed power signal, at least one transformed value from among the transformed values corresponding to a first, second, and third frequency line of the discrete Fourier transform, the first frequency line corresponding to the zero frequency, and apply an estimator of the angle of arrival using the calculated transformed value or values, the estimator being dependent on the reference index.

* * * * *